(12) United States Patent
Sinha et al.

(10) Patent No.: US 9,111,589 B2
(45) Date of Patent: Aug. 18, 2015

(54) MEMORY TIMING CIRCUIT

(71) Applicant: QUALCOMM Incorporated, San Diego, CA (US)

(72) Inventors: Rakesh Kumar Sinha, Bangalore (IN); Chirag Gulati, Rajasthan (IN); Ritu Chaba, Bangalore (IN); Sei Seung Yoon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 83 days.

(21) Appl. No.: 14/018,404

(22) Filed: Sep. 4, 2013

(65) Prior Publication Data

US 2015/0063046 A1 Mar. 5, 2015

(51) Int. Cl.
  *G11C 7/00* (2006.01)
  *G11C 7/06* (2006.01)
  *G11C 7/04* (2006.01)
  *G11C 7/08* (2006.01)
  *G11C 7/22* (2006.01)

(52) U.S. Cl.
  CPC .. *G11C 7/06* (2013.01); *G11C 7/04* (2013.01); *G11C 7/08* (2013.01); *G11C 7/227* (2013.01)

(58) Field of Classification Search
  CPC ..................................... G11C 7/12; G11C 7/14
  USPC ................................................ 365/203, 210.1
  See application file for complete search history.

(56) References Cited

U.S. PATENT DOCUMENTS

| | | | |
|---|---|---|---|
| 5,371,707 A * | 12/1994 | Ogawa | 365/190 |
| 5,550,769 A | 8/1996 | Hidaka et al. | |
| 6,977,834 B2 | 12/2005 | Onizawa et al. | |
| 7,859,920 B2 | 12/2010 | Jung et al. | |
| 2012/0147687 A1 | 6/2012 | Douzaka | |
| 2012/0287699 A1 | 11/2012 | Yun et al. | |

* cited by examiner

*Primary Examiner* — Huan Hoang
(74) *Attorney, Agent, or Firm* — Arent Fox LLP

(57) ABSTRACT

Disclosed are various apparatuses and methods for a memory with a multiple word line design. A memory timing circuit may include a dummy word line including a first portion and a second portion and further including capacitive loading that is lumped in the second portion of the dummy word line, a first transistor connected to the first portion of the dummy word line and configured to charge the dummy word line, and a second transistor connected to the second portion of the dummy word line and configured to discharge the dummy word line. A method may include charging a dummy word line using a first transistor, and discharging the dummy word line using a second transistor, wherein the dummy word line includes a first portion and a second portion and further includes capacitive loading that is lumped in the second portion of the dummy word line.

45 Claims, 5 Drawing Sheets

MEMORY TIMING CIRCUIT

BACKGROUND

1. Field

The present disclosure relates generally to integrated circuits, and more particularly, to a timing circuit for memory.

2. Background

A read word line is asserted during a read operation of memory cells. When the read word line is asserted, memory cells connected to that read word line provide their stored value/bit to a read bit line that is connected to a sense amplifier. If enabled at the appropriate time (e.g., when the read bit line is provided with the stored value/bit), the sense amplifier can detect the value/bit in the read bit line. A memory timing circuit may be used to determine the appropriate time to enable the sense amplifier. The memory timing circuit may generate a timing signal that closely tracks/emulates the signal in the read word line. However, variations in process, voltage, and/or temperature (PVT) conditions can affect the timing signal such that the timing signal does not closely track/emulate the signal in the read word line. Accordingly, there is a need in the art for a timing circuit that is resilient to variations in PVT conditions such that the timing signal closely tracks/emulates the signal in the read word line despite variations in PVT conditions.

SUMMARY

One aspect of a memory timing circuit is disclosed. A memory timing circuit may include a dummy word line including a first portion and a second portion and further including capacitive loading that is lumped in the second portion of the dummy word line, a first transistor connected to the first portion of the dummy word line and configured to charge the dummy word line, and a second transistor connected to the second portion of the dummy word line and configured to discharge the dummy word line.

One aspect of a method is disclosed. A method may include charging a dummy word line using a first transistor, and discharging the dummy word line using a second transistor, wherein the dummy word line includes a first portion and a second portion and further includes capacitive loading that is lumped in the second portion of the dummy word line.

One aspect of an apparatus is disclosed. An apparatus may include means for charging a dummy word line, means for discharging the dummy word line, wherein the dummy word line includes a first portion and a second portion and further includes capacitive loading that is lumped in the second portion of the dummy word line.

Other aspects of apparatuses and methods described herein will become readily apparent to those skilled in the art based on the following detailed description, wherein various aspects of apparatuses and methods are shown and described by way of illustration. These aspects may be implemented in many different forms and its details may be modified in various ways without deviating from the scope of the present invention. Accordingly, the drawings and detailed description provided herein are to be regarded as illustrative in nature and not as restricting the scope of the claims.

BRIEF DESCRIPTION OF THE DRAWINGS

Various aspects of apparatuses and methods will now be presented in the detailed description by way of example, and not by way of limitation, with reference to the accompanying drawings.

Figure 1:
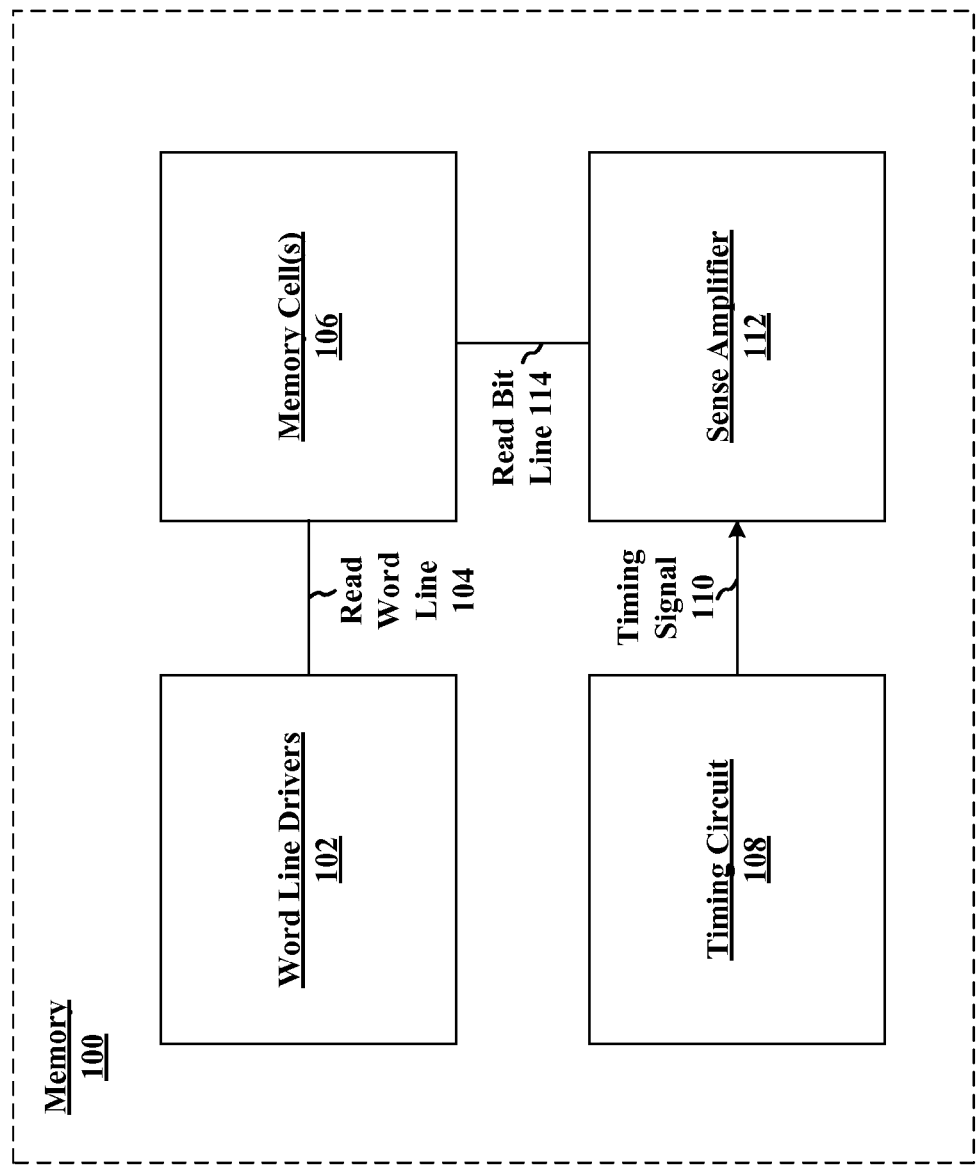
FIG. 1 is a block diagram of one example of a memory with a timing circuit.

The word "exemplary" is used herein to mean "serving as an example, instance, or illustration." Any aspect described herein as "exemplary" is not necessarily to be construed as preferred or advantageous over other aspects.

DETAILED DESCRIPTION

Various aspects of the disclosure will be described more fully hereinafter with reference to the accompanying drawings. This disclosure may, however, be embodied in many different forms by those skilled in the art and should not be construed as limited to any specific structure or function presented herein. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of this disclosure, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure and/or functionality in addition to or instead of other aspects of this disclosure. It should be understood that any aspect of the disclosure disclosed herein may be embodied by one or more elements of a claim.

Although particular aspects will be described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different circuits, technologies, systems, networks, and methods, some of which are illustrated by way of example in the drawings and in the following description. The detailed description and drawings are merely illustrative of the disclosure rather than limiting, the scope of the disclosure being defined by the appended claims and equivalents thereof. The various circuits described throughout this disclosure may be implemented in various forms of hardware.

FIG. 1 is a block diagram of one example of a memory 100 with a memory timing circuit 108. During a read operation of the memory 100, the word line drivers 102 assert a read word line 104 connected to one or more memory cells 106. When the read word line 104 is asserted, the memory cell(s) 106 connected to the read word line 104 may provide a stored value/bit to a read bit line 114 that is connected to a sense amplifier 112. The sense amplifier 112 may detect the value/bit in the read bit line 114 if the sense amplifier 112 is enabled at the appropriate time (e.g., when the read bit line 114 is provided the stored value/bit from the one or more memory cell(s) 106).

To determine the appropriate time to enable the sense amplifier 112, a memory timing circuit 108 may be used. The memory timing circuit 108 may generate a timing signal 110 that closely tracks/emulates the signal of the read word line 104. The timing signal 110 may be used for timing the enabling of the sense amplifier 112 for purposes of latching the value/bit in the read bit line 114. By emulating the signal in the read word line 104, the timing signal 110 enables the sense amplifier 112 at a time that closely corresponds to a time that the value/bit is provided to the read bit line 114 by the memory cell(s) 106. If the sense amplifier 112 is enabled at a time that is too early or too late (relative to the time that the value/bit is provided to the read bit line 114), the sense amplifier 112 may not properly latch the value/bit. Accordingly, the timing signal 110 generated by the memory timing circuit 108 emulates/tracks the signal of the read word line 104 as closely as possible.

Figure 2:
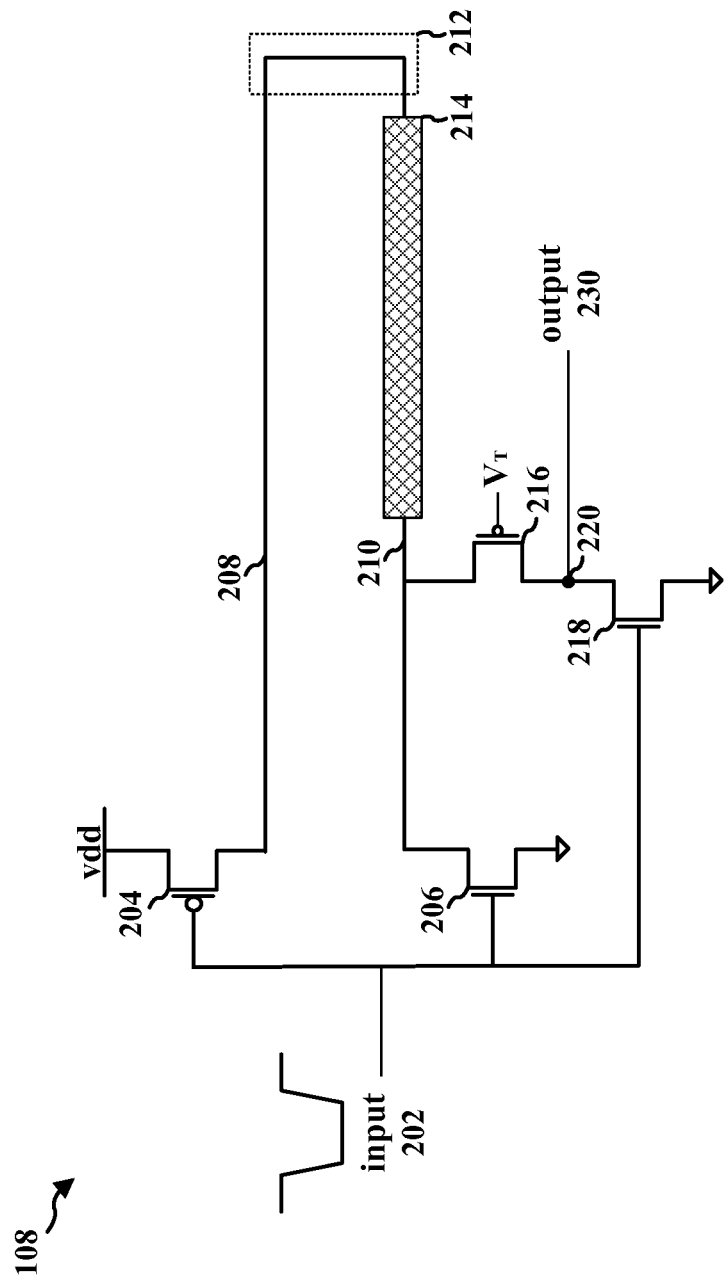
FIG. 2 is a schematic representation of one example of the memory timing circuit.

FIG. 2 is a schematic representation of one example of the memory timing circuit 108. A dummy word line includes a departure portion 208 and a return portion 210 that are connected to each other by a U-shaped portion 212. In some embodiments, as illustrated in FIG. 2, the departure portion 208 and the return portion 210 are approximately the same length. In some embodiments, as illustrated in FIG. 3, the individual lengths of the departure portion 208 and the return portion 210 are approximately half of the length of a corresponding read word line 330.

The departure portion 208 and the return portion 210 may extend in a parallel configuration relative to each other. Capacitive coupling between the departure and return portions 208, 210 may be formed as a result of this parallel configuration. Capacitive coupling may be reduced when the departure portion 208 and the return portion 210 are located in different metal layers. For example, the departure portion 208 may be located in a first metal layer and the return portion 210 may be located in a second metal layer (that is different from the first metal layer). Capacitive coupling between the first and second portions of the dummy word line may be based on the location of the first portion relative to the location of the second portion.

The return portion 210 may include capacitive loading 214. In FIGS. 2 and 3, the capacitive loading 214 is a part of the return portion 210. In some embodiments, although not illustrated in FIG. 2, the capacitive loading 214 may be a part of the departure portion 208. The capacitive loading 214 may include circuit components (e.g., 304 in FIG. 3) that provide substantially equivalent capacitive loading as the capacitive loading of the read word line 104 (see FIG. 1). For example, a circuit component 304 (see FIG. 3) may have a gate capacitance that is substantially similar to a gate capacitance of a bit cell of the memory. By providing substantially equivalent capacitive loading as the read word line 104 (see FIG. 1), the output signal 230 of the memory timing circuit 108 closely tracks/emulates the signal in the read word line 104 (see FIG. 1). Details about specific components that may be included in the capacitive loading 214 will be discussed below with reference to FIG. 3.

Figure 3:
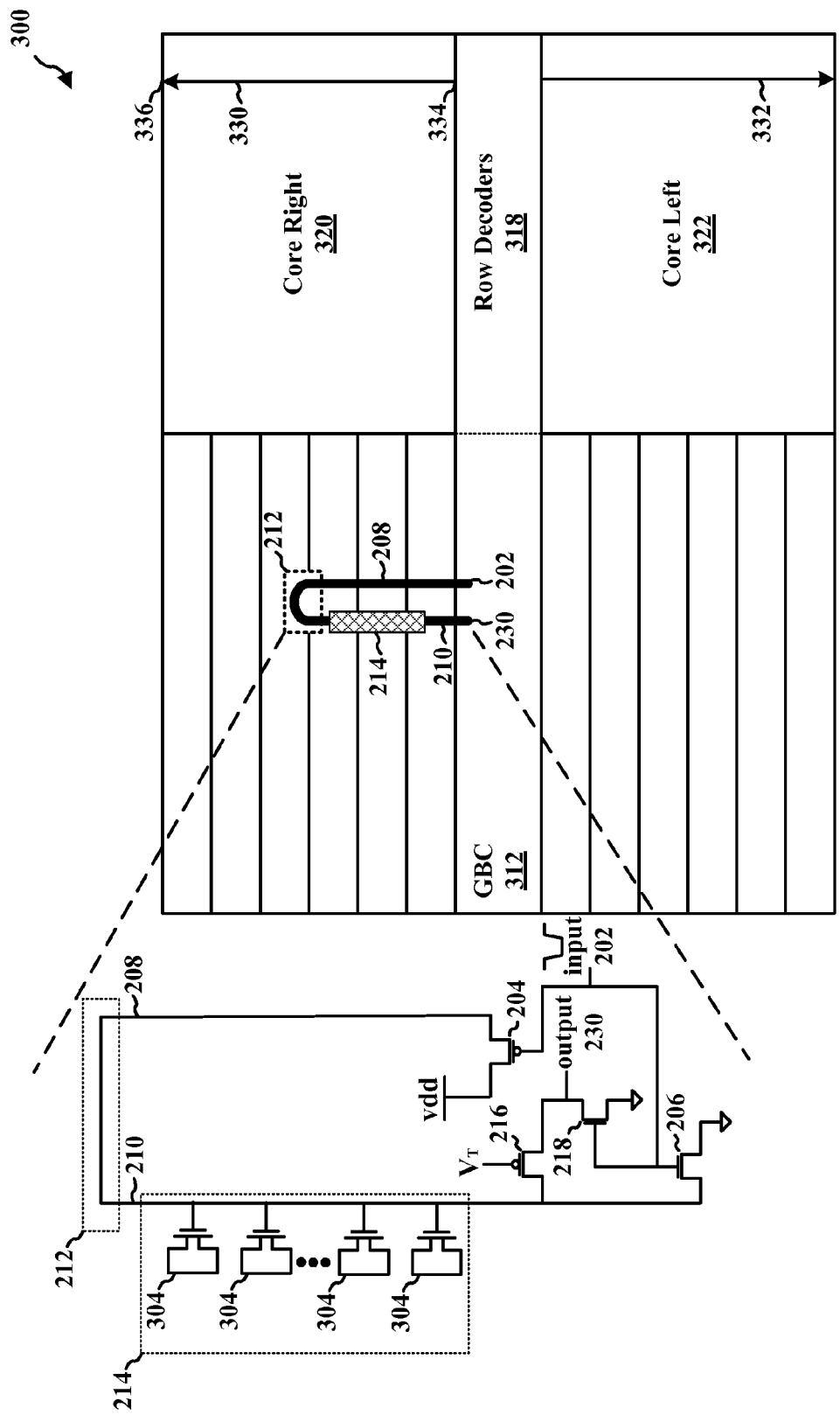
FIG. 3 is a schematic representation of the exemplary timing circuit in compiled SRAM.

For the example memory timing circuit 108 illustrated in FIGS. 2 and 3, the input 202 is a signal referred to as a read clock complement. With respect to input 202, the signal is initially high, then becomes low, and finally returns high. Initially, when the input 202 is high, n-type transistors 206, 218 are turned on. By turning on n-type transistor 206, the dummy word line is allowed to discharge via n-type transistor 206. By turning on n-type transistor 218, node 220 and output 230 are allowed to discharge via n-type transistor 218. Therefore, when the input 202 is high, the output 230 will be low.

As the input 202 transitions from high to low, n-type transistors 206, 218 are turned off and p-type transistor 204 is turned on, thereby pulling the signal in the dummy word line up to vdd. The amount of time needed for the dummy word line to reach vdd can be associated with the capacitative loading 214. For example, more capacitative loading may require more time for the dummy word line to reach vdd.

Subsequently, as the input 202 transitions from low to high, the p-type transistor 204 is turned off and n-type transistors 206, 218 are again turned on. As previously discussed, the n-type transistor 206 provides one path for discharge of the dummy word line. The amount of time needed for the dummy word line to undergo a particular amount of discharge can be associated with the capacitative loading 214. If the tripping transistor 216 is turned on, the n-type transistor 218 provides an additional path of discharge of the dummy word line. In the example illustrated in FIG. 2, the tripping transistor 216 is a voltage-gated, p-type transistor, which is turned on when the voltage applied to the gate of the tripping transistor 216 is equal to or lesser than a threshold voltage ($V_T$). Accordingly, when the voltage applied to the gate of the tripping transistor 216 is equal to or lesser than $V_T$ (and the input 202 is high), the dummy word line is allowed to discharge via transistors 216, 218, thereby causing output 230 to be low. In other embodiments, the gate of the tripping transistor 216 is tied to ground.

As illustrated in FIG. 2, the tripping transistor 216 has its source connected to the second portion (e.g., 210) of the dummy word line and has its drain connected to the output node 220 of the memory timing circuit 108. The tripping transistor 216 may also have its source connected to the drain of the n-type transistor 206. Also, the tripping transistor 216 may have its drain connected to the drain of the n-type transistor 218.

Although the example in FIG. 2 illustrates a voltage-gated, p-type transistor as the tripping transistor 216, it will be understood by one of ordinary skill in the art that other transistors may be utilized without deviating from the scope of the present disclosure. For example, although not illustrated in FIG. 2, the tripping transistor 216 may be an n-type, voltage-gated transistor, which is turned on when the voltage applied to the gate of the tripping transistor is equal to or greater than a threshold voltage ($V_T$). As another example, although not illustrated in FIG. 2, the tripping transistor 216 may be a p-type transistor having its gate coupled to ground.

The p-type transistor 204 provides a means for charging a dummy word line 208, 210. The dummy word line 208, 210 may include capacitative loading 214 that is lumped in a portion (e.g., 210) of the dummy word line. The n-type transistor 206 provides a means for discharging the dummy word line 208, 210. The p-type transistor 216 provides a means for tripping having a source connected to the second portion (e.g., 210) of the dummy word line and a drain connected to an output node 220 of the memory timing circuit 108.

FIG. 3 is a schematic representation of the exemplary memory timing circuit 108 in a compiled SRAM 300. Although FIG. 3 illustrates the compiled SRAM 300 as the exemplary memory having the memory timing circuit, it will be understood that other memory types may be utilized without deviating from the scope of the present disclosure. In this example, the compiled SRAM 300 includes a global bank control (GBC) 312, which may provide an input 202 to the memory timing circuit. The GBC 312 may also provide an address to the row decoders 318. Based on the address, the row decoders 318 determine the read word line(s) 330, 332 to assert. For example, the row decoders 318 may determine to assert read word line 332 to read a particular row of memory cells in the core left 322 and/or may determine to assert read word line 330 to read a particular row of memory cells in the core right 320.

In the example illustrated in FIG. 3, the lengths of the first and second portions 208, 210 of the dummy word line may be substantially the same length. The first and second portions 208, 210 of the dummy word line may each have a length that is approximately half of the length of a corresponding read word line 330. Accordingly, the total distance traveled by a signal from the input 202 to the output 230 will be approximately the same distance traveled by a signal from location 334 to location 336.

The circuit components 304 included in the capacitive loading 214 may be distributed in various arrangements throughout the dummy word line 208, 210. In FIGS. 2 and 3, the circuit components 304 are lumped in the return portion 210 of the dummy word line. An un-lumped or uniform distribution of the circuit components 304 throughout the dummy word line may cause the memory timing circuit 108 to lack robustness, meaning that the memory timing circuit 108 may not precisely track/emulate the read word line 104 under varying PVT conditions (see FIG. 1). In contrast, a lumped distribution of circuit components 304 in one portion (e.g., 210) of the dummy word line improves the robustness of the memory timing circuit 108 such that variations in PVT conditions do not substantially affect the tracking/emulation of the signal in the read word line 104 by the timing signal 110 (see FIGS. 1-3). Additional advantages associated with lumping circuit components 304 will be discussed below with reference to FIG. 4.

Although the examples illustrated in FIGS. 2 and 3 illustrate the capacitive loading 214 as being located on the return portion 210 of the dummy word line, one of ordinary skill in the art will appreciate that alternative configurations of the capacitive loading 214 may be utilized without deviating from the scope of the present disclosure. For example, although not illustrated in FIG. 3, the capacitive loading 214 may be lumped entirely in the departure portion 208 of the dummy word line. As another example, although not illustrated in FIG. 3, the capacitive loading 214 may be distributed in more than one lumped region throughout the departure portion 208, return portion 210, and/or U-turn portion 212.

In the example illustrated in FIG. 3, the circuit components 304 of the capacitive loading 214 may be dummy cells. A dummy cell may have a gate capacitance that is substantially similar to a gate capacitance of a bit cell of the memory. As one of ordinary skill in the art will know, each dummy cell may be formed from various hardware components (e.g., transistors and/or inverters). Each dummy cell provides a capacitive load to the dummy word line 208, 210. The total capacitive load of the dummy cells may emulate the total capacitive load of the memory cell(s) 106 on the read word line 104 (see FIG. 1). As previously discussed, this may result in a timing signal 110 that closely tracks/emulates the signal in the read word line 104 (see FIG. 1). Although the example in FIG. 3 illustrates dummy cells as the circuit components 304, one of ordinary skill in the art will appreciate that alternatives to dummy cells may be utilized without deviating from the scope of the present disclosure.

Figure 4:
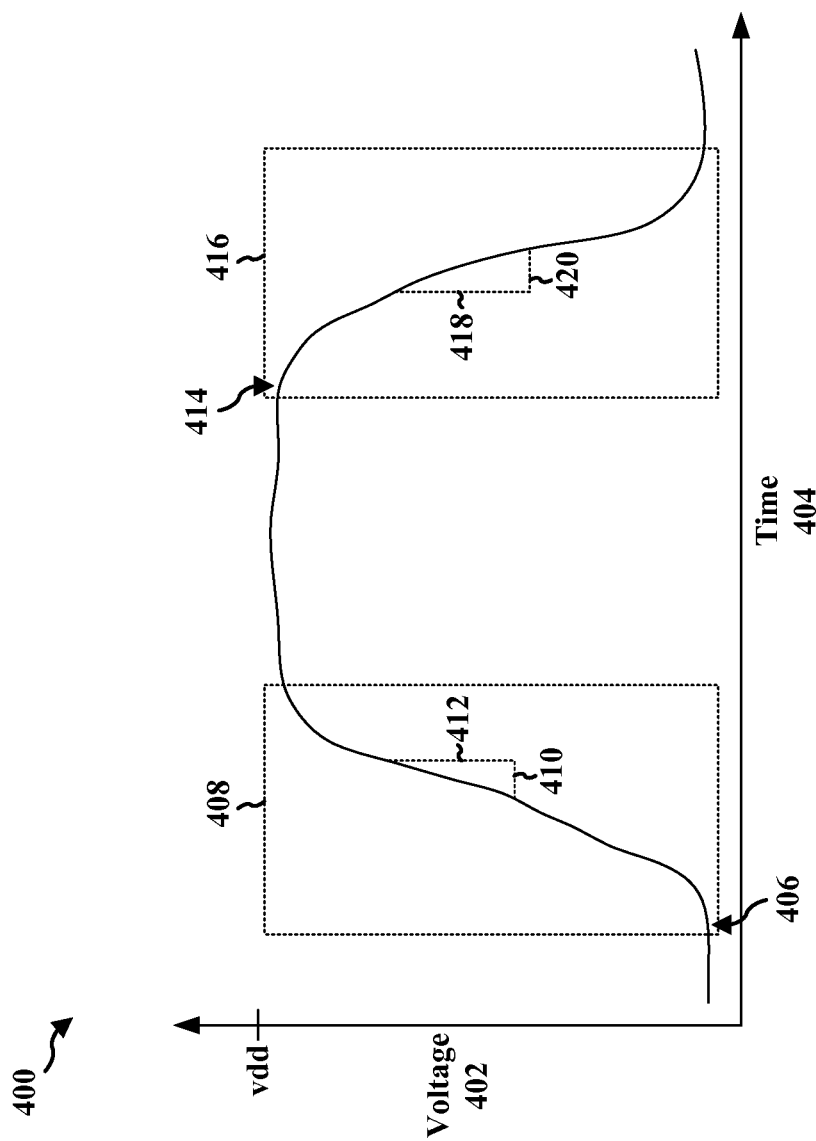
FIG. 4 is an example of a timing signal generated by the memory timing circuit.

FIG. 4 is an example of a signal generated by the memory timing circuit. The waveform 400 shows the voltage 402 of the output 230 (see FIGS. 2 and 3) as a function of time 404. A first portion of the waveform 400 includes a rising portion 408, which has a rising slope defined by an amount of rise 412 during an amount of time 410. The rising portion 408 begins at rising point 406. Referring back to FIGS. 2 and 3, the rising point 406 can occur when the input 202 transitions from high to low, thereby turning on p-type transistor 204 and allowing the voltage to rise to vdd. As previously discussed, the amount of time required for the voltage in the dummy word line to reach vdd may depend upon the capacitative loading of the dummy word line. Accordingly, the rising slope of the rising portion 408 may vary according to the capacitative loading 214 (see FIGS. 2-4). A second portion of the waveform 400 includes a falling portion 416, which has a falling slope defined by an amount of fall 418 during an amount of time 420. The falling portion begins at falling point 414. Referring back to FIGS. 2 and 3, the falling point 414 can occur when the input 202 transitions from low to high, thereby turning on n-type transistor 218 and allowing output 230 to discharge.

As previously discussed, a first discharge path is provided via transistor 206, and a second discharge path is provided via transistors 216, 218. The waveform of the signal in the read word line 104 (see FIG. 1) can have a steep falling slope. To emulate this, the present disclosure provides more than one path of discharge (e.g., the two aforementioned paths of discharge). Two paths of discharge can provide a faster rate of discharge than can be provided by only one path of discharge. A faster rate of discharge can result in a steeper falling slope. Since the signal in the read word line 104 has a steep falling slope, the timing signal 110 generated by the memory timing circuit 108 can closely track/emulate the signal in the read word line 104 (see FIG. 1). Further, because the gate of the tripping transistor 216 is voltage-dependent, the second path of discharge (via transistors 216, 218) can be controlled such that the falling point 414 of the timing signal 110 occurs at approximately the same time as the falling point of the waveform of the read word line 104 (see FIGS. 1 and 4).

The sense amplifier 108 may be enabled and/or disabled based on the time of the rising edge and/or falling edge, respectively, of the timing signal 110 generated by the memory timing circuit 108 (see FIG. 1). The sense amplifier 112 may be enabled at the rising edge (e.g., at rising point 406 in FIG. 4). The sense amplifier 112 may be disabled at the falling edge (e.g., at falling point 414 in FIG. 4). If the rising edge of the timing signal 110 occurs earlier or later in time relative to the time of the rising edge of the signal in the read word line 104, the sense amplifier 112 may be enabled too soon or too late, respectively. If the falling edge of the timing signal 110 occurs earlier or later in time relative to the time of the falling edge of the signal in the read word line 104, the sense amplifier 112 may be disabled too soon or too late, respectively.

Under varying PVT conditions, some existing designs utilizing an un-lumped or uniform distribution of circuit components may lack robustness. As illustrated in FIGS. 2 and 3, the present disclosure may include a lumped distribution of circuit components 304 in a portion (e.g., 210) of the dummy word line. By lumping circuit components in a portion of the dummy word line, the present disclosure provides a slew rate (e.g., the maximum possible rate of change of a signal) that is substantially similar at both low and high voltages. As such, the rising and falling slopes of the waveform of the timing signal closely tracks/emulates the waveform of the read word line 104 despite variations in PVT conditions. Accordingly, lumping circuit components 304 can result in improved PVT resilience and robustness for the memory timing circuit 108.

Figure 5:
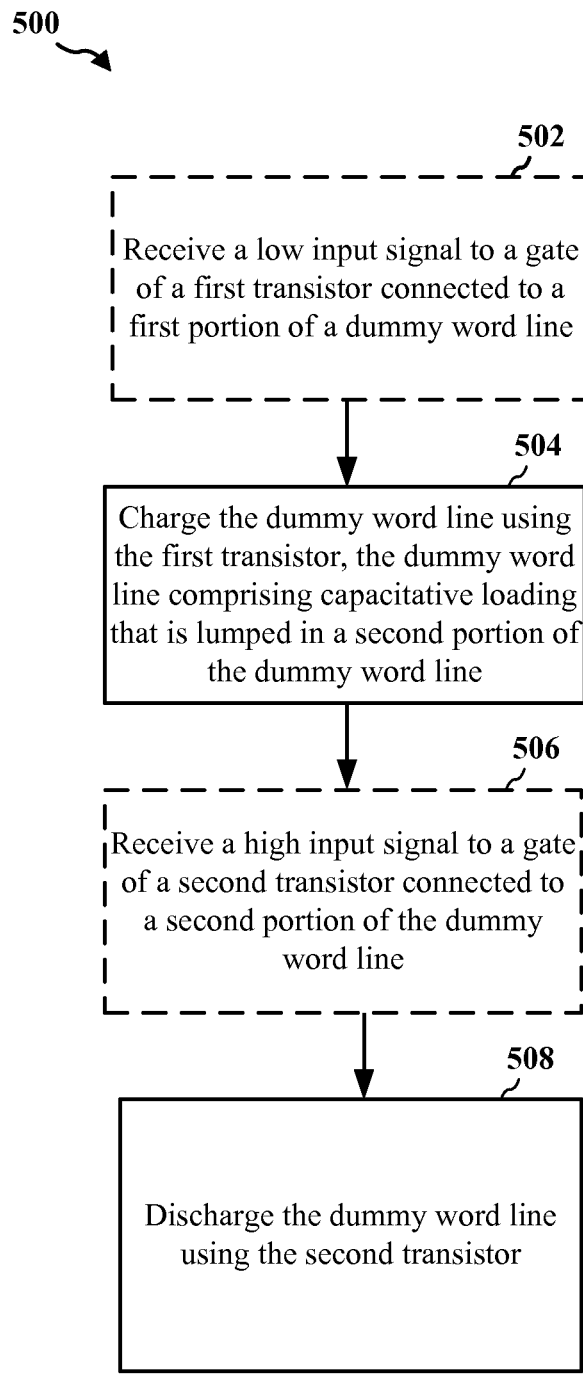
FIG. 5 is a flowchart illustrating an example of an operation performed by the memory.

FIG. 5 is a flowchart illustrating an exemplary operation performed by the memory. The operation may include a method 500 performed by a circuit. At block 502, the circuit may receive a low input signal to a gate of a first transistor connected to a first portion of a dummy word line. For example, referring to FIGS. 2 and 3, the input 202 may transition from high to low, thereby turning on p-type transistor 204 of the departure portion 208 of the dummy word line. At block 504, the circuit may charge the dummy word line using the first transistor, the dummy word line comprising capacitative loading that is lumped in a second portion of the dummy word line. For example, referring to FIGS. 2 and 3, turning on p-type transistor 204 will raise the voltage of the dummy word line to vdd. As illustrated in FIGS. 2, 3, capacitative loading 214 is lumped in the return portion 210 of the dummy word line. At block 506, the circuit may receive a high input signal to a gate of a second transistor connected to a second portion of the dummy word line. For example, referring to FIGS. 2 and 3, the input 202 may transition from low to high, thereby turning on n-type transistor 206, which is coupled to the return portion 210 of the dummy word line. At block 508, the circuit may discharge the dummy word line using the second transistor. For example, referring to FIGS. 2 and 3, the dummy word line may be discharged through the n-type transistor 206.

The foregoing method 500 is merely one exemplary illustration of an operation that may be performed by the memory. Additional methods may be performed by the memory without deviating from the scope of the present disclosure. Further, the specific order or hierarchy of blocks in the processes disclosed in FIG. 5 is merely an illustration of one example. Based upon design preferences, the specific order or hierarchy of blocks in the process may be re-arranged, amended, and/or modified. The accompanying method claims include various limitations related to a process, but the recited limitations are not meant to be limited in any way by the specific order or hierarchy depicted in FIG. 5, unless expressly so stated in the claims.

Although various aspects of the present invention have been described as software implementations, those skilled in the art will readily appreciate that the various software modules presented throughout this disclosure may be implemented in hardware, or any combination of software and hardware. Whether these aspects are implemented in hardware or software depends upon the particular application and design constraints imposed on the overall system. Those with ordinary skill in the art may implement the described functionality in varying ways for each particular application, but such implementation decisions should not be interpreted as causing a departure from the scope of the invention. The foregoing description is provided to enable any person skilled in the art to fully understand the scope of the invention. Modifications to various aspects disclosed herein will be readily apparent to those skilled in the art. Accordingly, the scope of the claims will not be limited to the various exemplary embodiments provided herein. Reference to an element in the singular is not intended to mean "one and only one" unless specifically stated as such; instead, reference to an element in the singular shall mean "one or more." Unless specifically stated otherwise, the term "some" refers to one or more. No claim element is to be construed under the provisions of 35 U.S.C. §112(f) unless the element is expressly recited using the phrase "means for" or, in the case of a method claim, the element is recited using the phrase "step for." The claims are not intended to be limited to the various aspects of this disclosure, but are to be accorded the full scope consistent with the language of the claims. All structural and functional equivalents to the various components of the exemplary embodiments described throughout this disclosure that are known to those of ordinary skill in the art are expressly incorporated herein by reference and are intended to be encompassed by the claims.

What is claimed is:

1. A memory timing circuit comprising:
a dummy word line comprising a first portion and a second portion and comprising capacitative loading that is lumped in the second portion of the dummy word line;
a first transistor connected to the first portion of the dummy word line and configured to charge the dummy word line; and
a second transistor connected to the second portion of the dummy word line and configured to discharge the dummy word line,
wherein:
the first portion of the dummy word line is located in a first metal layer; and
the second portion of the dummy word line is located in a second metal layer that is different from the first metal layer.

2. The memory timing circuit of claim 1, wherein the first transistor is a p-type transistor and the second transistor is an n-type transistor.

3. The memory timing circuit of claim 1, further comprising a tripping transistor having a source connected to the second portion of the dummy word line and a drain connected to an output node of the memory timing circuit.

4. The memory timing circuit of claim 3, wherein the tripping transistor is a p-type transistor.

5. The memory timing circuit of claim 3, wherein a gate of the tripping transistor is tied to ground.

6. The memory timing circuit of claim 3, wherein the source of the tripping transistor is connected to a drain of the second transistor.

7. The memory timing circuit of claim 3, further comprising a third transistor, wherein the drain of the tripping transistor is connected to a drain of the third transistor.

8. The memory timing circuit of claim 1, wherein the capacitative loading of the dummy word line emulates capacitative loading of a corresponding word line of the memory timing circuit such that a signal in the dummy word line tracks a signal in the corresponding word line.

9. The memory timing circuit of claim 1, wherein the capacitative loading of the dummy word line comprises one or more dummy bit cells.

10. The memory timing circuit of claim 1, wherein:
the first transistor is further configured to charge the dummy word line when an input signal to a gate of the first transistor is low; and
the second transistor is further configured to discharge the dummy word line when an input signal to a gate of the second transistor is high.

11. The memory timing circuit of claim 1, wherein the first and second portions of the dummy word line are connected together by a U-shaped portion.

12. The memory timing circuit of claim 1, wherein the first and second portions of the dummy word line extend in a parallel configuration relative to each other.

13. The memory timing circuit of claim 1, wherein the first and second portions of the dummy word line are substantially the same length.

14. The memory timing circuit of claim 1, wherein the first and second portions of the dummy word line each have a length that is approximately half of a length of a corresponding word line.

15. The memory timing circuit of claim 1, wherein capacitative coupling between the first and second portions of the dummy word line is based on the location of the first portion relative to the location of the second portion.

16. A method comprising:
charging a dummy word line using a first transistor, the dummy word line comprising a first portion and a second portion and comprising capacitative loading that is lumped in the second portion of the dummy word line; and discharging the dummy word line using a second transistor, wherein:
the first portion of the dummy word line is located in a first metal layer; and
the second portion of the dummy word line is located in a second metal layer that is different from the first metal layer.

17. The method of claim 16, wherein the first transistor is a p-type transistor and the second transistor is an n-type transistor.

18. The method of claim 16, wherein the dummy word line further comprises a tripping transistor having a source connected to the second portion of the dummy word line and a drain connected to an output node.

19. The method of claim 18, wherein the tripping transistor is a p-type transistor.

20. The method of claim 18, wherein a gate of the tripping transistor is tied to ground.

21. The method of claim 18, wherein the source of the tripping transistor is connected to a drain of the second transistor.

22. The method of claim 18, wherein the dummy word line further comprises a third transistor, wherein the drain of the tripping transistor is connected to a drain of the third transistor.

23. The method of claim 16, wherein the capacitative loading of the dummy word line emulates capacitive loading of a corresponding word line such that a signal in the dummy word line tracks a signal in the corresponding word line.

24. The method of claim 16, wherein the capacitative loading of the dummy word line comprises one or more dummy bit cells.

25. The method of claim 16, further comprising:
charging the dummy word line using the first transistor when an input signal to a gate of the first transistor is low; and
discharging the dummy word line using the second transistor when an input signal to a gate of the second transistor is high.

26. The method of claim 16, wherein the first and second portions of the dummy word line are connected together by a U-shaped portion.

27. The method of claim 16, wherein the first and second portions of the dummy word line extend in a parallel configuration relative to each other.

28. The method of claim 16, wherein the first and second portions of the dummy word line are substantially the same length.

29. The method of claim 16, wherein the first and second portions of the dummy word line each have a length that is approximately half of a length of a corresponding word line.

30. The method of claim 16, wherein capacitive coupling between the first and second portions of the dummy word line is based on the location of the first portion relative to the location of the second portion.

31. An apparatus comprising:
means for charging a dummy word line, the dummy word line comprising a first portion and a second portion and comprising capacitative loading that is lumped in the second portion of the dummy word line; and
means for discharging the dummy word line,
wherein:
the first portion of the dummy word line is located in a first metal layer; and
the second portion of the dummy word line is located in a second metal layer that is different from the first metal layer.

32. The apparatus of claim 31, wherein the means for charging is a p-type transistor and the means for discharging is an n-type transistor.

33. The apparatus of claim 31, further comprising:
means for tripping having a source connected to the second portion of the dummy word line and a drain connected to an output node.

34. The apparatus of claim 33, wherein the means for tripping is a p-type transistor.

35. The apparatus of claim 33, wherein a gate of the means for tripping is tied to ground.

36. The apparatus of claim 33, wherein the source of the means for tripping is connected to a drain of the means for discharging.

37. The apparatus of claim 33, further comprising a third transistor, wherein the drain of the means for tripping is connected to a drain of the third transistor.

38. The apparatus of claim 31, wherein the capacitive loading of the dummy word line emulates capacitive loading of a corresponding word line such that a signal in the dummy word line tracks a signal in the corresponding word line.

39. The apparatus of claim 31, wherein the capacitive loading of the dummy word line comprises one or more dummy bit cells.

40. The apparatus of claim 31, wherein:
the means for charging is configured to charge the dummy word line when an input signal to a gate of the means for charging is low; and
the means for discharging is configured to discharge the dummy word line when an input signal to a gate of the discharging means is high.

41. The apparatus of claim 31, wherein the first and second portions of the dummy word line are connected together by a U-shaped portion.

42. The apparatus of claim 31, wherein the first and second portions of the dummy word line extend in a parallel configuration relative to each other.

43. The apparatus of claim 31, wherein the first and second portions of the dummy word line are substantially the same length.

44. The apparatus of claim 31, wherein the first and second portions of the dummy word line each have a length that is approximately half of a length of a corresponding word line.

45. The apparatus of claim 31, wherein capacitive coupling between the first and second portions of the dummy word line is based on the location of the first portion relative to the location of the second portion.

* * * * *